US012681092B2

(12) United States Patent
Lundqvist et al.

(10) Patent No.: US 12,681,092 B2
(45) Date of Patent: Jul. 14, 2026

(54) METHOD AND SYSTEM FOR STATE OF CHARGE CALIBRATION FOR AN ELECTRICAL ENERGY STORAGE SYSTEM

(71) Applicant: VOLVO TRUCK CORPORATION, Gothenburg (SE)

(72) Inventors: Henrik Lundqvist, Mölnlycke (SE); Faisal Altaf, Västra Frölunda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 797 days.

(21) Appl. No.: 18/181,230

(22) Filed: Mar. 9, 2023

(65) Prior Publication Data

US 2023/0324462 A1     Oct. 12, 2023

(30) Foreign Application Priority Data

Apr. 6, 2022     (EP) ..................................... 22166978

(51) Int. Cl.
*H02J 7/00*          (2026.01)
*B60L 58/13*         (2019.01)
(Continued)

(52) U.S. Cl.
CPC ............ *G01R 31/367* (2019.01); *B60L 58/13* (2019.02); *G01R 31/3842* (2019.01); *G01R 31/396* (2019.01)

(58) Field of Classification Search
USPC ........................................................ 320/134
See application file for complete search history.

(56) References Cited

U.S. PATENT DOCUMENTS 9,766,298 B2     9/2017 Lennevi et al.
2003/0214303 A1*  11/2003 Ying .................... G01R 31/392
                                                        324/426
(Continued)

FOREIGN PATENT DOCUMENTS

CN      108717164 A     10/2018
CN      113614554 A     11/2021

OTHER PUBLICATIONS

Extended European Search Report in corresponding European Application No. 22166978.1 dated Oct. 7, 2022 (6 pages).

*Primary Examiner* — Samuel Berhanu
(74) *Attorney, Agent, or Firm* — Jeffri A. Kaminski; Venable LLP

(57) ABSTRACT

A method for performing SOC calibration for an electrical energy storage system of an electrified vehicle is described The method includes determining a predicted time duration needed to complete a SOC calibration, scheduling a time slot sufficient for completing the SOC-calibration according to the predicted time duration, the scheduled time slot being during a predicted downtime for the electrified vehicle, wherein when at the scheduled time slot: discharging the electrical energy storage system to a steep part of an open circuit voltage versus SOC curve of the electrical energy storage system by an on-board discharge circuit within an acceptable time duration without connecting the electrical energy storage system to a discharging system external to the vehicle; once at an open circuit voltage with gradient with respect to SOC exceeding a threshold indicative of a steep part of the open circuit voltage versus SOC curve, measuring an electrical energy storage system voltage to re-calibrate the SOC of the electrical energy storage system.

14 Claims, 3 Drawing Sheets

(51) Int. Cl.
G01R 31/367 (2019.01)
G01R 31/3842 (2019.01)
G01R 31/396 (2019.01)

(56) References Cited

U.S. PATENT DOCUMENTS

| | | | |
|---|---|---|---|
| 2010/0213946 A1* | 8/2010 | Kirchev | ........... G01R 19/16542 |
| | | | 324/427 |
| 2013/0229154 A1* | 9/2013 | Benjamin | ............ G01R 31/378 |
| | | | 320/132 |
| 2016/0190829 A1 | 6/2016 | Mei et al. | |
| 2016/0372941 A1 | 12/2016 | Moorhead et al. | |
| 2020/0223422 A1 | 7/2020 | Ye et al. | |

* cited by examiner

METHOD AND SYSTEM FOR STATE OF CHARGE CALIBRATION FOR AN ELECTRICAL ENERGY STORAGE SYSTEM

TECHNICAL FIELD

The present disclosure relates to a method for performing state of charge calibration for an electrical energy storage system of an electrified vehicle. The present disclosure also relates to a discharge circuit, control unit, and computer program. Although the method and system will be described in relation to a vehicle in the form of a truck, the method and system can also be efficiently incorporated in other vehicle types such as busses, light-weight trucks, passenger cars, construction equipment, marine vessels, and industrial equipment, as long as they are at least partly electrically propelled.

BACKGROUND

Batteries are becoming a more common source of energy for providing propulsion power to vehicles. Such batteries are rechargeable batteries and consist of several battery cells that may be connected in series and/or in parallel forming a complete battery pack for the vehicle.

In energy management of electric vehicles, the battery state of charge is typically monitored. The state of charge, SOC, is important to monitor since it provides the driver of an indication of the presently remaining charge in the battery. However, SOC cannot be directly measured and must therefore be estimated. SOC estimation functions are relatively complex and expensive to implement and verify. Due to the complex nature of SOC estimations there an increased risk of errors that may lead to vehicle down time.

Accurate SOC estimations require a precise SOC calibration and is often performed when the vehicle is resting or under maintenance in a workshop. For accurate SOC calibration, the battery SOC-open circuit voltage (OCV) characteristics should not be in a flat region of the OCV-SOC curve in which the OCV for a given SOC is not well defined. Therefore, time consuming conditioning of the battery is often needed to reach a suitable point on the SOC-OCV curve which leads to further vehicle downtime.

Accordingly, there is room for improvement with regards to performing SOC calibrations of propulsion batteries for vehicles.

SUMMARY

An object of the invention is to provide an improved method and discharge circuit for performing state of charge calibration for an electrical energy storage system of an electrified vehicle.

According to the first aspect of the invention, there is provided a method for performing state of charge calibration for an electrical energy storage system of an electrified vehicle, the method comprising: determining a predicted time duration needed to complete a SOC calibration, scheduling a time slot sufficient for completing the state of charge-calibration according to the predicted time duration, wherein when at the scheduled time slot:

discharging the electrical energy storage system to a steep part of an open circuit voltage versus state of charge curve of the electrical energy storage system by an on-board discharge circuit within an acceptable time duration without connecting the electrical energy storage system to a discharging system external to the vehicle; and, once at an open circuit voltage with gradient with respect to state of charge exceeding a threshold indicative of the steep part of the open circuit voltage versus state of charge curve, measuring an electrical energy storage system voltage to re-calibrate the state of charge of the electrical energy storage system.

The method preferably includes an initial step of detecting a state of charge, SOC, estimation issue that indicates a need for SOC calibration. In other words, detecting the issue triggers the subsequent steps of the method for performing the SOC calibration. Initiation of the trigger can be reactive or predictive.

A reactive trigger means that the issue is detected after it has occurred whereby the state of charge calibration is initiated. A predictive trigger means that the state of charge issue is predicted beforehand so that state of charge calibration is initiated to prevent the issue from occurring. For example, if the vehicle is continued in operation for a given additional time duration (e.g., days or weeks), an issue may appear that causes state of charge estimation issues. By analysing energy consumption historical data for each particular trip under similar kind of operating conditions (ambient temperature, load, topography, speed etc), it is possible to track how many kilometres range is available, and if any significant divergence in electric range (kilometres) is detected for a given a trip and SOC swing then this can be used an initial signature for detecting issue in the SOC estimation. As a further possibility, an SOC swing, e.g. from a first SOC to a second SOC, may be analysed for a given route and whether the swing diverges over time for the given route. If large divergences are detected a fault code may be triggered for required maintenance and SOC calibration.

Further, the trigger of the SOC-calibration may also be manually provided by a user such as a driver or someone in a vehicle monitoring centre that may monitor the electrical energy storage system remotely.

State of charge, SOC, which is mentioned herein is the present level of charge in the electrical energy storage system compared to its full capacity and may be given as a percentage value.

By the provision of performing the discharge to a steep part of the OCV-SOC curve by an on-board discharge circuit there is no need for connecting the electrical energy storage system to external systems for performing SOC-calibration. In other words, there is no need for a time-consuming visit at a workshop for performing SOC-calibration. Preferably, the scheduled time slot is during a predicted downtime for the electrified vehicle such as during parking of a bus or truck in a depot. In this way, by scheduling the time slot for completing the SOC-calibration to be during a time of a predicted downtime, the vehicle is not subject to unnecessary downtime.

In other words, by means of embodiments described herein, SOC-calibration may be performed without having to depend on external systems of the vehicle, during a time slot scheduled so that vehicle downtime for the user is avoided or at least reduced.

The electrical energy storage system is discharged to a steep part of the OCV-SOC curve, where accurate SOC-calibration can be performed. The discharge is performed within the acceptable time period that is sufficiently short to fit, with a margin, in the predicted time duration, thereby avoiding further unnecessary downtime. The discharge circuit is powerful enough to perform the discharge within the acceptable time period.

A predicted time duration needed for performing a SOC calibration may be determined from at least two estimations: time for discharging the electrical energy storage system and time for performing voltage measurement for re-calibrating the SOC. The scheduled time slot is equal to or longer than the predicted time duration needed for performing a SOC calibration.

Firstly, the time required for discharging the electrical energy storage system is the time duration for discharging the electrical energy storage system to the steep part of the OCV versus SOC curve of the electrical energy storage system from a present SOC level. More specifically, this may include calculating a dischargeable energy (E), e.g., by integrating electrical energy storage system OCV curve with respect to SOC, from current SOC to the target lower SOC also considering internal electrical energy storage system power losses using information regarding internal imped-ance of the electrical energy storage system and multiplying with electrical energy storage system capacity Q. More specifically:

$$\hat{E}(t) = Q \cdot \int_{SoC_{steep}}^{SoC(t)} V_{oc}(\xi) \cdot d\xi$$

Where Voc is the Open Circuit Voltage (OCV) curve of the electrical energy storage system, Q is a Coulombic Capacity Estimate, $SoC_{steep}$ is the lower limit of a configured SOC window, and SOC (t) is SOC at present time instant 't'.

As an alternative implementation, the electrical energy storage system may be charged to a steep part of the OCV versus SOC curve. In such case it is the time required for charging the electrical energy storage system to a steep part that is estimated. This implementation requires use of exter-nal charger or on-board charger along with an additional power source. For example, in hybrid vehicles, which can-not be charged externally, a generator driven by combustion engine can be employed to charge the electrical energy storage system.

In some possible implementations, a SOC uncertainty may be included in the dischargeable energy calculation. For example, given a SoC tolerance range, i.e., SoC-σ to SoC+σ, dischargeable energy is calculated at both limits of the tolerance range resulting in a range of dischargeable energy. More precisely, the dischargeable energy is calculated con-sidering uncertainty in the initial SoC(t). In this way a range of energy estimates are obtained instead of one single estimate point. For example, the uncertainty can be included in the calculation as follows:

$$\hat{E}_{max}(t) = Q \cdot \int_{SoC_{steep}}^{SoC(t)+\sigma} V_{oc}(\xi) \cdot d\xi$$

$$\hat{E}_{min}(t) = Q \cdot \int_{SoC_{steep}}^{SoC(t)-\sigma} V_{oc}(\xi) \cdot d\xi$$

Now using $\hat{E}_{max}$ and $\hat{E}_{min}$, maximum and minimum limits of discharge time are computable. This information can be used to determine worst-case and best-case discharge dura-tion. For example, this tolerance information to indicate range of waiting time instead of giving single deterministic number.

Further a discharge current/power capability of the dis-charge circuit may be determined or acquired. Using the discharge current/power of the discharge circuit and the required discharge energy needed for reaching the target SOC, the time duration for the discharge can be calculated.

In addition, determining the predicted time duration may further comprise including a resting period for the electrical energy storage system after discharging and the time for performing the voltage measurement for recalibrating SOC.

The electrical energy storage system discussed herein may be considered a propulsion battery interpreted as pro-viding propulsion energy to the vehicle. Thus, the vehicle may be an electrical, hybrid, or plug-in hybrid vehicle comprising an electrical engine, wherein the battery pro-vides power to the electrical engine for providing propulsion for the electrical, hybrid, or plug-in hybrid vehicle. The battery may be Li-ion battery comprising multiple cells arranged in series and in parallel as is known in the art.

The steep part of the OCV-SOC curve is considered a part where a robust and reliable SOC-calibration reading can be performed. A steeper part provides a more robust and accurate re-calibration; however it is desirable to not dis-charge the battery excessively due to the added time duration but also for not accelerating an ageing rate for the battery cells. A typical SOC is less than 20% but more typically between 5 and 15% SOC for a LFP (Lithium Iron Phos-phate) battery. Purely as an example, the OCV curve may be considered to be in the steep part when the OCV-curve gradient is more than about 10 mV/% SOC. However, the OCV-curve gradient may be adaptable depending on the accuracy of the measurement system used. Generally, a lower gradient threshold is possible if the measurement accuracy is higher. For example, if an absolute maximum measurement inaccuracy less than 1 mV then the OCV-curve gradient threshold may be at 5 mV/% SOC. Further, the OCV-SOC curve gradient threshold may also be adapted according to specific battery cell chemistries.

According to an example embodiment, the method may further comprise evaluating drive pattern data of the vehicle and battery usage data of the battery for predicting the time slot using machine learning or model-based methods. The time slot is predicted for use of the SOC-calibration routine.

The predicted time slot may be predicted based on his-torical driving data of the vehicle. From the historical driving data, it may be possible to find patterns of downtime of the vehicle, for example during night-time or during some time slots on certain days where the vehicle is not used. This prediction may require data driven algorithms including machine learning and deep learning algorithms. Further, the predicted downtime may be determined from knowledge of scheduled events of the user such as travelling where the vehicle is not to be used or other scheduled events where the vehicle is not used, such as resting time in a depot for buses and trucks. Such scheduled events may be extracted from cloud-based services including schedule applications of the user via e.g., an electronic calendar or similar.

Scheduling a time slot sufficient for completing the SOC-calibration may be performed either by a control unit on-board the vehicle or on a remote server as a cloud-based service, or a combination thereof.

According to an example embodiment, the scheduled time slot may be further based on at least one of: predicted downtime of the vehicle, a prior planned time window for cell balancing, and planned workshop visits. During cell balancing, the battery cells are discharged which provides an advantageous time slot for also performing SOC-recalibra-tion at the same time. Further, a planned workshop visit is suitable since a vehicle downtime is anyway scheduled.

The discharge circuit is preferably external to cell bal-ancing discharge circuits that typically are too weak for the purpose of SOC-recalibration.

According to an example embodiment, discharging the battery may be performed using a subsystem of the vehicle as load. For example, an electric machine as a subsystem may be powered on for faster discharging of the battery. Further, auxiliary loads such as for example thermal management systems for cabin cooling and heating may also serve as a load for battery discharging.

According to an example embodiment, the method may comprise discharging the battery to a steep part of an open circuit voltage versus SOC curve of the battery by an on-board discharge circuit within an acceptable time duration without connecting the battery to a vehicle traction voltage system.

According to an example embodiment, discharging the battery may be performed during a cell balancing procedure for balancing the voltages of the cells of the battery.

An acceptable time duration may be adapted depending on a specific implementation but is preferably less than 8 hours. Preferably, the time duration is adapted to not cause any significant loss to the user of the vehicle.

According to an example embodiment, the step of discharging may comprise applying a discharge power of at least 200 W per battery pack.

The method may be autonomously initiated by a control unit of the battery system configured to determine the need for SOC-calibration.

According to the second aspect of the invention, there is provided a discharge circuit for discharging a battery for enabling SOC calibration for a propulsion battery of an electrified vehicle, the discharge circuit configured to: receive a signal for initiating a discharge event when at a scheduled time slot sufficient for performing the SOC-calibration according to a predicted time duration needed to complete a SOC calibration, the scheduled time slot being during a predicted downtime for the electrified vehicle, the discharge circuit being configured to discharge the battery to a steep part of an open circuit voltage versus SOC curve of the battery within an acceptable time duration without connecting the battery to a system external to the vehicle; and stop the discharge once at an open circuit voltage with a gradient with respect to SOC that exceeds a threshold gradient indicative of a steep part of the open circuit voltage versus SOC curve, whereby a SOC-calibration is enabled.

The discharge circuit may be adapted to apply a discharge power of at least 200 W.

Effects and features of the second aspect of the invention are largely analogous to those described above in connection with the first aspect.

According to a third aspect of the invention, there is provided a vehicle comprising the discharge circuit according to the second aspect.

According to a fourth aspect of the invention, there is provided a computer program comprising program code means for performing the steps the first aspect when the program is run on a computer.

According to a fifth aspect of the invention, there is provided a computer readable medium carrying a computer program comprising program code means for performing the steps of the first aspect when the program product is run on a computer.

According to a sixth aspect of the invention, there is provided control unit controlling a SOC calibration for a propulsion battery of an electrified vehicle, the control unit being configured to perform the steps of the method according to the first aspect.

Effects and features of the third, fourth, fifth, and sixth aspects are largely analogous to those described above in relation to the first aspect.

There is also provided a battery management system comprising the discharge circuit according to the second aspect and a control unit according to the sixth aspect.

Further features of, and advantages will become apparent when studying the appended claims and the following description. The skilled person will realize that different features may be combined to create embodiments other than those described in the following, without departing from the scope of the present disclosure.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
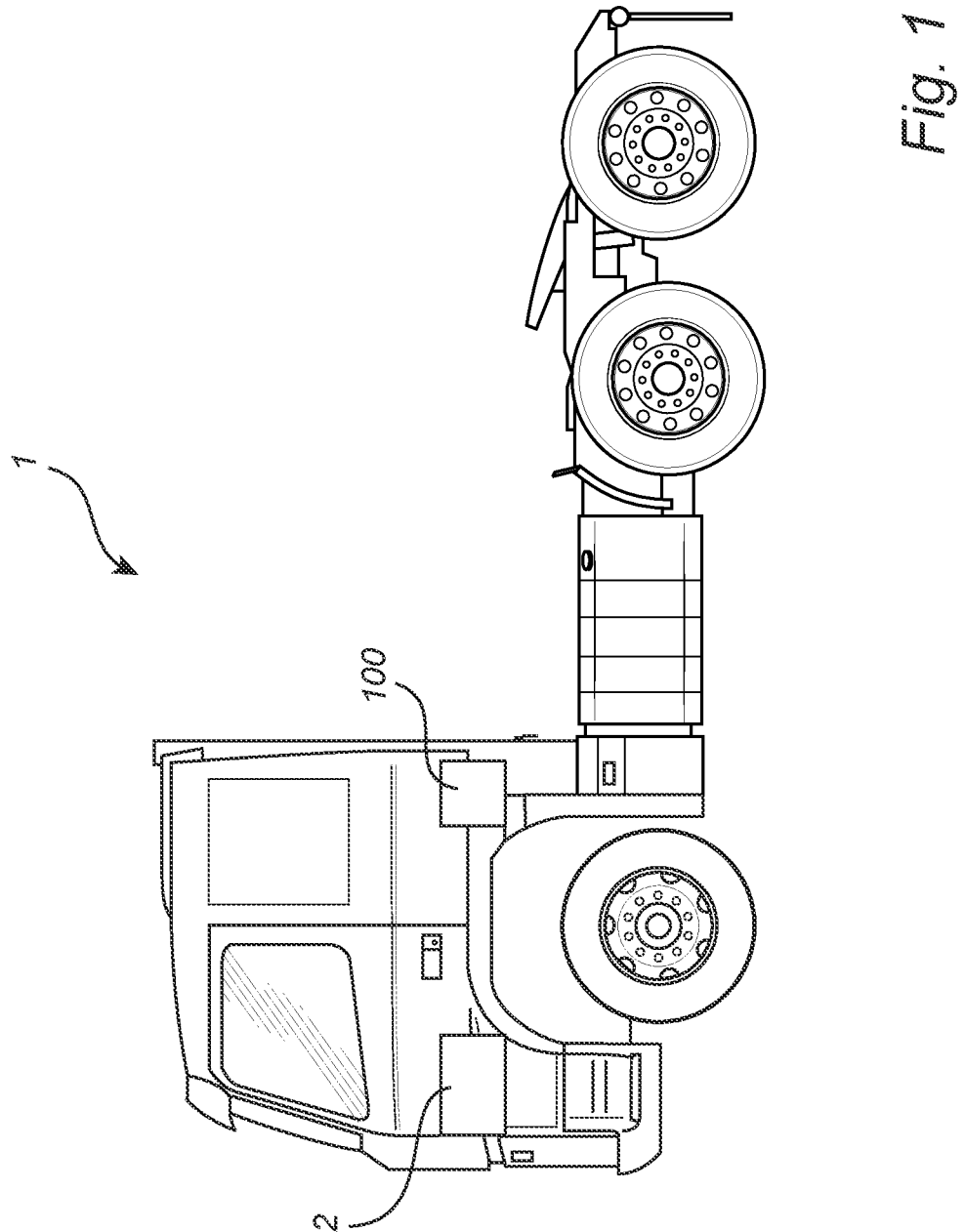
FIG. 1 is a vehicle in the form an electrical truck according to example embodiments of the invention.

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims.

Like reference character refer to like elements throughout the description.

FIG. 1 illustrates a vehicle in the form of an electrical truck 1 comprising a propulsion battery 2 generally comprising a plurality of series and parallel connected battery cells. The propulsion battery 2 is arranged to provide power to an electrical engine (not shown) arranged for providing propulsion for the electrical truck 1. The electrical truck 1 further comprises a battery managing system 100 which is configured to monitor battery cell characteristics such as SOC, battery voltage, and optionally temperature of the battery cells, and to control a SOC calibration for a propulsion battery 2, as will be discussed further herein. The propulsion battery 2 may be a Li-ion battery comprises multiple cells electrically connected in series and in parallel.

Although the vehicle in FIG. 1 is depicted as a heavy-duty truck, embodiments of the present disclosure may as well be implemented in other types of vehicles, such as in busses, light-weight trucks, passenger cars, construction equipment, industrial applications, and marine applications including e.g. vessels or ships.

Figure 2:
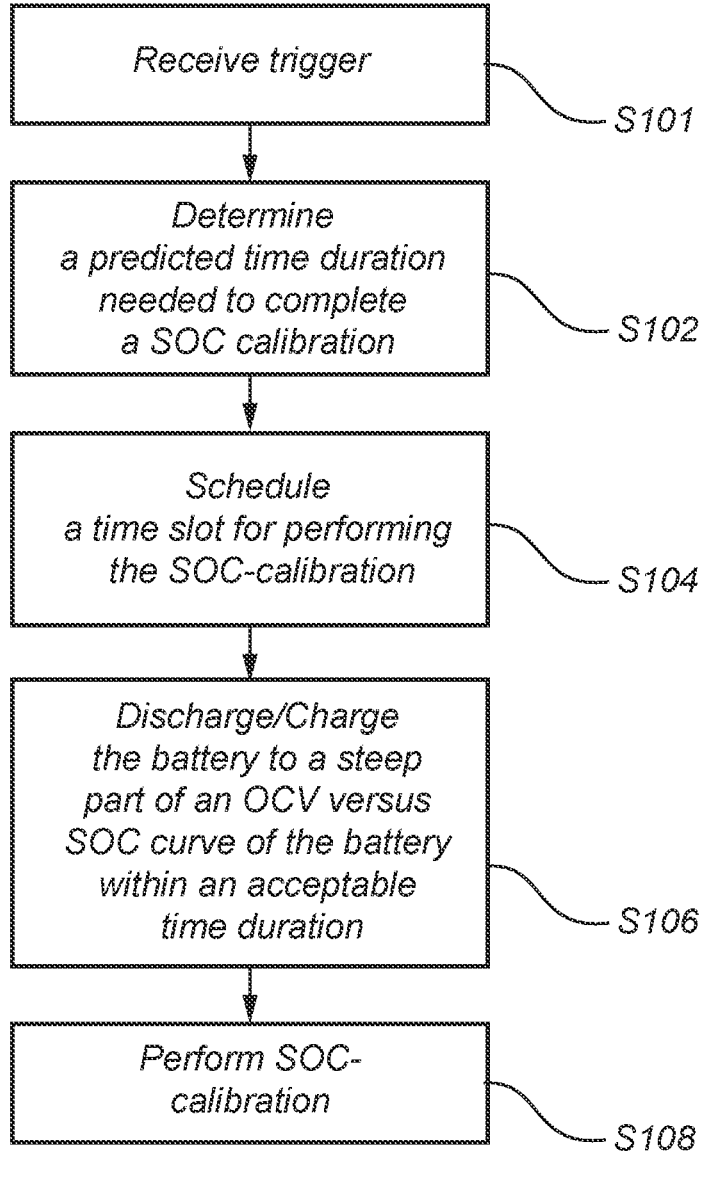
FIG. 2 is a flow-chart of method steps according to example embodiments of the invention.
Figure 3:
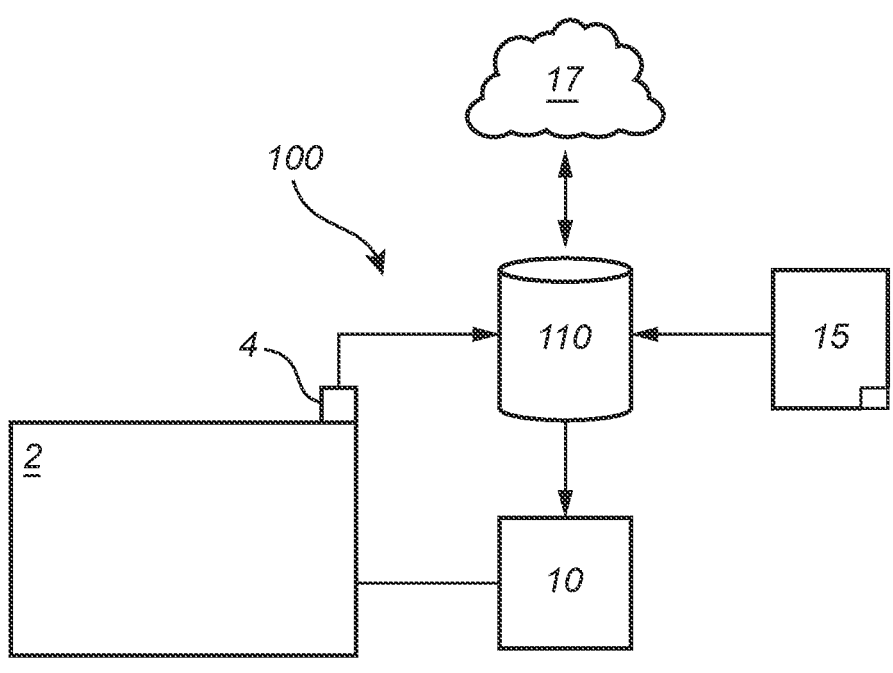
FIG. 3 is a block diagram of a system according to example embodiments of the invention.

FIG. 2 is a flow-chart of method steps and FIG. 3 is a block diagram of a system 100 of embodiments of the present invention.

In step S101, a trigger is received by the control unit 110 for initiating a SOC-calibration. The trigger may be generated as reactive, predictive, or manual trigger as discussed herein.

In step S102 of the method, a predicted time duration needed to complete a SOC calibration is determined. This prediction may be performed by the control unit 110 based on estimations of the present SOC of the battery 2 by means of voltage measurements performed by voltage sensor 4 configured to measure a present open circuit voltage of the battery 2.

The time duration needed for performing a SOC calibration includes a time duration for discharging the battery 2, a resting period, and a time duration for performing voltage measurement for re-calibrating the SOC. The time duration for discharging the battery to the steep part 5 of the open circuit voltage versus SOC curve 40 of the battery 2, see FIG. 4, from a present SOC level is the total discharging time. In other words, the sensor 4 may firstly provide a measurement result to the control unit 110 for estimating a present SOC of the battery 2. Subsequently, the control unit 110 may calculate a dischargeable energy (E), e.g., by integrating battery OCV curve with respect to SOC, from the current SOC to a target lower SOC and multiplying with electrical energy storage system capacity Q as described herein. This calculation may also include internal battery power losses using predetermined information regarding internal impedance of the battery 2.

As is often the case, a SOC uncertainty is often present in such SOC estimations. To account for this, the SOC uncertainty may be included in the dischargeable energy calculation. For example, given a SoC tolerance range, i.e., SoC$-\sigma$ to SoC$+\sigma$, dischargeable energy is calculated at both limits of the tolerance range resulting in a range of dischargeable energy.

Further a discharge current/power capability of the discharge circuit 10 used for the subsequent discharging of the battery 2 may be determined or acquired. The discharge current/power capability may be estimated from knowledge of the circuit design or from prior testing of the discharge circuit. Using the discharge current/power of the discharge circuit and the required discharge energy needed for reaching the target SOC, the time duration for the discharge can be calculated by the control unit 110.

Finally, the predicted time duration includes a resting period for the battery after discharging and the time for performing the voltage measurement for recalibrating SOC.

Once the control unit 110 has predicted the time duration in step S102, the method turns to step S104 comprising scheduling a time slot sufficiently long for completing the SOC-calibration according to the predicted time duration. Thus, the control unit 110 with knowledge of the time duration required for fully finalizing the SOC-recalibration, is configured to find a suitable time slot that can fit the required time duration for completing the SOC-calibration.

The scheduled time slot may for example be during a predicted downtime for the electrified vehicle to ensure that no additional downtime is needed. The scheduled time slot may also be during a planned time window for cell balancing or time slots for planned workshop visits.

The control unit 110 may for example have knowledge of a planned time window for performing a cell balancing of the battery cells. Data concerning time windows for cell balancing may be available to control unit 110 from the battery management system 100 having such time windows planned for cell balancing stored in memory or received via the cloud 17. Further, the scheduled time slot may be during a planned workshop visit of the vehicle. Data concerning workshop visits may be available through cloud-based services 17 storing information and meeting calls concerning such coming workshop visits. Further, information concerning predicted downtime for the electrified vehicle may also be accessible through the cloud 17.

In some embodiments, the control unit 110 has access to data driven methods such as machine learning or modelling methods 15. Using these models or methods, the control unit 110 may evaluate drive pattern data of the vehicle 1 and battery usage data of the battery 2 for predicting the time slot. For example, the model or algorithm may have been trained on historical drive pattern data that indicates e.g., time, day, durations, of historical or prior driving sessions using the vehicle. The model or algorithm may also have been trained on battery usage data including time, day, and durations of discharge peaks and valleys and charging sessions of the battery 2. The model or algorithms may have been fed with such data and trained using supervised or unsupervised training, or other statistical methods. Based on subsequently received driving data and battery data, e.g., collected by the sensor 4 or by other drive control systems or GPS data, the model or algorithm may predict with some confidence that a suitable time slot is present for performing SOC calibration.

At this stage, the time slot for performing a SOC calibration is determined, and when at the scheduled time slot, discharging the battery 2 to a steep part 5 of an open circuit voltage versus SOC curve 40 of the battery 2 by an on-board discharge circuit 10 in step S106. The discharge circuit 10 is configured to be able to discharge the battery 2 within an acceptable time duration without connecting the battery to a discharging system external to the vehicle 1.

In alternative implementing, the battery is charged by an charger or generator to an upper steep part 6 of the curve 40 at higher OCV than at the flat part 7.

Figure 4:
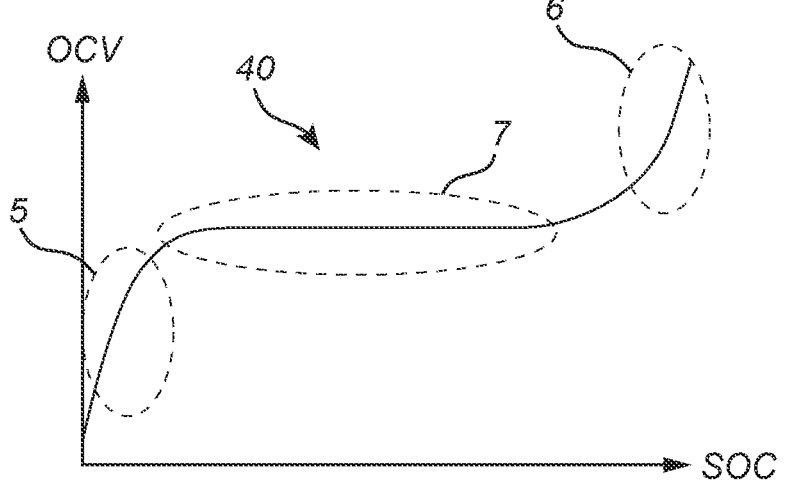
FIG. 4 illustrates a conceptual OCV-SOC curve.

For a discussion about the steep part of the OCV curve reference is made to FIG. 4 illustrating a conceptual OCV-SOC curve 40. Generally, an OCV-SOC curve 40 can be considered to include a flat part 7 and at least one steep part 5. In the flat part 7, which is the operation region of the battery 2, a small error in the measured OCV translates to a larger error in SOC due to the flat nature in the curve. Therefore, a SOC calibration, where a measured OCV is associated with a SOC for the SOC-recalibration, it is desirable to reach the steep part 5 where a more accurate calibration can be performed. An upper steep part 6 is also indicated.

The control unit 110 may monitor the gradient of the OCV-SOC curve for determining when the steep part 5 is reached. Purely as an example, when the gradient is about 10 mV % SOC or more, the control unit may conclude that the steep part 5 is reached. However, the OCV-curve gradient may be adaptable depending on the accuracy of the measurement system used and the cell chemistry, as discussed above. For example, if an absolute maximum measurement inaccuracy less than 1 mV then the OCV-curve gradient threshold may be at mV/% SoC.

Returning to FIGS. 2 and 3, discharging is performed using an on-board discharge circuit 10 without using external discharging system. This means that the SOC-calibration can be performed without visiting a workshop and that it can be initiated by a battery management system of the vehicle 1, for example including the control unit 110. The SOC-calibration may also be initiated via a cloud-based service or mobile app. In a further advantageous embodiment, discharging the battery to a steep part 5 of an open circuit voltage versus SOC curve 40 is performed without connecting the battery to a vehicle traction voltage system. Thus, the discharging is completely performed by the discharging circuit 10 that may be onboard the vehicle 1 or even enclosed in the battery 2 housing itself.

In some possible implementations, the discharging the battery is performed also using a subsystem of the vehicle as load.

The discharge circuit 10 is configured to receive a signal from the control unit 110 for initiating a discharge event when at the scheduled time slot sufficient for performing the SOC-calibration according to the predicted time duration. The signals from the control unit 110 controls the discharge circuit to discharge the battery to the steep part 5 of the OCV-SOC curve 40 within the acceptable time duration without connecting the battery to a system external to the vehicle.

A propulsion battery 2 includes multiple battery cells arranged in series and in parallel as is known in the art. To avoid that some cells are overcharged or over-discharged, it is common practice to with some intervals balance the SOC of the cells. During such balancing process the cells are often discharged. Thus, since the cells are being discharged for balancing, it is advantageous to also perform the SOC calibration simultaneously to avoid unnecessary downtime. According, discharging the battery 2 for SOC calibration is preferably performed during a cell balancing procedure for balancing the voltages of the cells of the battery 2. For example, the control unit 110 that may be configured to initiate a cell balancing procedure, may at the same time initiates the SOC-calibration process including discharging the cells.

Discharging should be performed within the time of the time slot, which should be an acceptable time duration for discharging. Although the acceptable time duration may vary depending on the specific implementation and use case at hand, a typical acceptable time duration 8 hours or less.

Accordingly, the discharge circuit 10 should be configured to discharge the battery 2 to the steep part within the acceptable time duration. For this, the discharge circuit 10 should be powerful enough. For example, the discharge circuit 10 may be adapted to apply a discharge power of at least 200 W.

As an example, a battery enclosed discharging circuit may be configured to apply at least a discharge power $P_{discharge}$ given by $$P_{discharge} \approx E_{battery} \cdot (SOC(t) - SOC_{steep})/8$$

Where $SOC_{steep}$ is the lower SoC target value in a steep part 5 of OCV curve 40, such as for example 15% and 8 is the number of hours. This may lead to a discharge power of about 200 W per battery for a HEV bus battery system.

The discharge circuit comprise discharge components like resistors, capacitors, inductors, switching components like transistors and/or relays. Further, the discharge circuit may include heat sinks, cooling channels and connectors for guiding a coolant. In other to monitor various parameters the discharge circuit may include temperature sensors, coolant flow sensors, pressure sensors, current and voltage sensors. Further, it may include power and temperature control and supervision provided by the battery management system. The discharge circuit is generally a dc/dc converter to actuate battery cells i.e., to generate discharge load on battery cells, along with dissipative devices to dissipate battery's energy.

Once at an open circuit voltage with gradient with respect to SOC exceeding a threshold indicative of a steep part 5 of the open circuit voltage versus SOC curve 40, measuring a propulsion battery voltage using the sensor 4, to re-calibrate the SOC of the propulsion battery 2 in step S108. At this stage, the control unit 110 stops the discharge using the discharge circuit 10 to enable a SOC-calibration. For a SOC-calibration the sensor 4 measures an OCV and sets a value for the SOC at this OCV.

More specifically, SOC-calibration is typically done by, once the battery is charged or discharged to a desired/needed SOC-level or cell-voltage level where the OCV-SOC gradient is sufficiently high, firstly resting the battery for a stipulated diffusion/relaxation time in order to obtain an accurate and stable cell voltage value. Based on this voltage value, a SOC value is read from predefined OCV look-up tables which provide a relationship between open-circuit-voltage of battery and its internal SoC level. In some cases, the OCV may also have dependence on temperature and current direction i.e., two curves: one for charge and one for discharge. In short, for a given voltage measurement value, a look-up table is for finding the corresponding SoC value set for the calibration. If the exact voltage value is not available in the table then a linear interpolation between two nearest points may be used.

Further, an uncertainty in the initial SoC may also be considered while discharging, or charging, as mentioned above. In short, a "worst case" initial SoC is considered and the discharging the battery is started. During discharge, coulomb counting is performed while drawing a certain constant power (P) from the battery cells which is known. Since the discharge power is known or measured the amount of energy ($E_{battery}$) needed to discharge before we reach a certain SoC level (e.g. $SOC_{steep}$) can also be estimated according to the following relationships, with or without uncertainty $\sigma$:

$$SoC_{steep} = SoC(t_f) = SoC(t_0) - \frac{1}{E_{battery}} \int_{t_0}^{t_f} P_{discharge} \cdot d\tau$$

$$SoC_{steep} = SoC(t_f) = (SoC(t_0) + \sigma) - \frac{1}{E_{battery}} \int_{t_0}^{t_f} P_{discharge} \cdot d\tau$$

$$SoC_{steep} = SoC(t_f) = (SoC(t_0) - \sigma) - \frac{1}{E_{battery}} \int_{t_0}^{t_f} P_{discharge} \cdot d\tau$$

Note that final time $t_f$ will depend on uncertainty level $\sigma$.

The control unit 110 may be configured to autonomously initiate the SOC calibration described herein. Thus, the control unit 110 of the battery system 100 is configured to determine the need for SOC-calibration of the battery. The control unit 110 may for example initiate SOC-calibration at given intervals, or the control unit 110 can identify, initiate, and monitor the need for SOC-calibration by means of continuously monitoring the OCV-SOC curve and associated errors, e.g., a too large error may indicate the need for re-calibrating SOC.

Furthermore, the control unit 110 may be configured to detect a state of charge estimation issue that indicates a need for SOC calibration. In other words, if the control unit 110 detects the issue it triggers the subsequent steps of the method for performing the SOC calibration. Initiation of the trigger can be reactive or predictive.

A reactive trigger means that the issue is detected after it has occurred whereby the state of charge calibration is initiated. For example, the control unit 110 may receive fault codes indicating an issue.

A predictive trigger means that the state of charge issue is predicted beforehand so that state of charge calibration is initiated to prevent the issue from occurring. For example, if the vehicle is continued in operation for a given additional time duration (e.g., days or weeks), an issue may appear that causes state of charge estimation issues. The control unit 110 may predict such issue based on combinations of measurements performed by the sensors of the battery management system. can for example detect the issue using model-based or data-driven diagnosis techniques. For example, by analysing energy consumption historical data for each particular trip under similar kind of operating conditions (ambient temperature, load, topography, speed etc), the control unit 110 may track how many kilometres range is available, if any significant divergence in electric range (kilometres) is detected by the control unit 110 for a given a trip and SoC swing then this can be used an initial signature for detecting issue in the SoC estimation. As a further possibility, the control unit 110 may analyse an SoC swing for a given route and determine if the swing diverges over time. If large divergences are detected a fault code may be triggered for required maintenance and SOC calibration.

The control unit 110 may also receive a manual trigger for initiating the SOC-calibration. A manual trigger is provided by a user or vehicle monitoring centre for manually, on demand, initiating SOC-calibration.

The control unit 110 is either hardwired or wirelessly connected to the sensor 4 or discharge circuit 10 or to a memory storing the models or algorithms 15. Further, a wireless communication system of the vehicle 1 is configured to provide wireless communication with the cloud 17. Wireless communication systems include known protocols of telecommunications and Wi-Fi means. The models or algorithms 15 may be stored on a memory in the could 17 or on a local memory of the vehicle 1.

In some implementations, the discharge circuit may include cooling flanges that may be connected to a battery- or discharge circuitry encapsulation or housing itself. The cooling system may be driven by a battery pack or battery system enclosed coolant pump or could be utilizing a surrounding system coolant pump via control by the battery management system. In hybrid and fuel cell vehicles, the cooling system typically does not need power from HV battery thereby implying no need to connect the main contactors of HV battery pack to the rest of the vehicle for powering the cooling system. The discharge circuit may be cooled either by an external vehicle cooling system or an internal battery cooling system. The external vehicle cooling system does not necessarily need power from the propulsion battery, i.e., the battery contactors do not need to be closed, as there is another power source such as e.g., a fuel-cell or 12/24V battery or generator connected with combustion engine. This reduces complexity of control functionality during the self-calibration routine presented herein. Including a cooling system reduces the time duration for discharging the battery.

In a multi battery system, we can also develop more advanced functionality using battery pack or battery system discharge circuit/equipment that enables us to shuffle energy between batteries instead of discharging. Accordingly, discharging a battery may mean that the energy is shuffled to another battery of the vehicle.

There is also provided a method for performing state of charge calibration for an electrical energy storage system of an electrified vehicle, the method comprising: determining a predicted time duration needed to complete a state of charge calibration, scheduling a time slot sufficient for completing the state of charge-calibration according to the predicted time duration, wherein when at the scheduled time slot: charging the electrical energy storage system to a steep part 6 of an open circuit voltage versus state of charge curve of the electrical energy storage system within an acceptable time duration; once at an open circuit voltage with gradient with respect to state of charge exceeding a threshold indicative of a steep part of the open circuit voltage versus state of charge curve, measuring an electrical energy storage system voltage to re-calibrate the state of charge of the electrical energy storage system.

A control unit may include a microprocessor, microcontroller, programmable digital signal processor or another programmable device. Thus, the control unit comprises electronic circuits and connections (not shown) as well as processing circuitry (not shown) such that the control unit can communicate with different parts of the truck such as the brakes, suspension, driveline, in particular an electrical engine, an electric machine, a clutch, and a gearbox in order to at least partly operate the truck. The control unit may comprise modules in either hardware or software, or partially in hardware or software and communicate using known transmission buses such as CAN-bus and/or wireless communication capabilities. The processing circuitry may be a general-purpose processor or a specific processor. The control unit comprises a non-transitory memory for storing computer program code and data upon. Thus, the skilled addressee realizes that the control unit may be embodied by many different constructions. A non-transitory memory may be provided as e.g. a hard disk drive (HDD), solid state drive (SDD), USB flash drive, SD card, CD/DVD, and/or as any other storage medium capable of non-transitory storage of data.

The control functionality of the present disclosure may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures, and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general-purpose computer, special purpose computer, or special purpose processing machines to perform a certain function or group of functions.

Although the figures may show a sequence the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

It is to be understood that the present invention is not limited to the embodiments described above and illustrated in the drawings; rather, the skilled person will recognize that many changes and modifications may be made within the scope of the appended claims.

The invention claimed is:

1. A method for performing state of charge calibration for an electrical energy storage system of an electrified vehicle, the method comprising:

determining a predicted time duration needed to complete a state of charge calibration, scheduling a time slot sufficient for completing the state of charge-calibration according to the predicted time duration, wherein when at the scheduled time slot:

discharging the electrical energy storage system to a steep part of an open circuit voltage versus state of charge curve of the electrical energy storage system by an on-board discharge circuit within an acceptable time duration without connecting the electrical energy storage system to a discharging system external to the vehicle;

once at an open circuit voltage with gradient with respect to state of charge exceeding a threshold indicative of the steep part of the open circuit voltage versus state of charge curve, measuring a voltage of the electrical energy storage system to re-calibrate the state of charge of the electrical energy storage system.

2. The method according to claim 1, wherein the scheduled time slot is further based on at least one of: during a predicted downtime for the electrified vehicle, a prior planned time window for cell balancing, and planned workshop visits.

3. The method according to claim 1, wherein discharging the electrical energy storage system is performed using a subsystem of the vehicle as load.

4. The method according to claim 1, comprising discharging the electrical energy storage system to the steep part of an open circuit voltage versus state of charge curve of the electrical energy storage system by an on-board discharge circuit within an acceptable time duration without connecting the electrical energy storage system to a vehicle traction voltage system.

5. The method according to claim 1, wherein discharging the electrical energy storage system is performed during a cell balancing procedure for balancing the voltages of the cells of the electrical energy storage system.

6. The method according to claim 1, wherein the acceptable time duration for discharging is less than 8 hours.

7. The method according to claim 1, wherein the step of discharging comprises applying a discharge power of at least 200 W.

8. The method according to claim 1, further comprising:

evaluating drive pattern data of the vehicle and electrical energy storage system usage data of the electrical energy storage system for predicting the time slot using machine learning or modelling methods.

9. The method according to claim 1, wherein the method is autonomously initiated by a control unit of the electrical energy storage system configured to determine the need for state of charge-calibration.

10. A discharge circuit for discharging an electrical energy storage system for enabling state of charge calibration for an electrical energy storage system of an electrified vehicle, the discharge circuit configured to:

receive a signal for initiating a discharge event when at a scheduled time slot sufficient for completing the state of charge-calibration according to a predicted time duration needed to perform a state of charge calibration, the discharge circuit being configured to discharge the electrical energy storage system to a steep part of an open circuit voltage versus state of charge curve of the electrical energy storage system within an acceptable time duration without the electrical energy storage system being connected to a system external to the vehicle; and stop the discharge once at an open circuit voltage with a gradient with respect to state of charge that exceeds a threshold gradient indicative of the steep part of the open circuit voltage versus state of charge curve, whereby a state of charge-calibration is enabled.

11. The discharge circuit according to claim 10, adapted to apply a discharge power of at least 200 W.

12. A vehicle comprising a discharge circuit according to claim 10.

13. A non-transitory computer readable medium carrying a computer program comprising program code for performing the steps of claim 1 when said program code is run on a computer.

14. A control unit for controlling a state of charge calibration for an electrical energy storage system of an electrified vehicle, the control unit being configured to perform the steps of the method according to claim 1.

* * * * *